(12) United States Patent
Ishii et al.

(10) Patent No.: US 7,846,620 B2
(45) Date of Patent: Dec. 7, 2010

(54) PHASE SHIFT MASK AND METHOD FOR MANUFACTURING LIGHT-COLLECTING DEVICE

(75) Inventors: Motonori Ishii, Osaka (JP); Kazutoshi Onozawa, Osaka (JP); Kimiaki Toshikiyo, Osaka (JP); Toshinobu Matsuno, Kyoto (JP); Takanori Yogo, Kyoto (JP)

(73) Assignee: Panasonic Corporation, Osaka (JP)

( * ) Notice: Subject to any disclaimer, the term of this patent is extended or adjusted under 35 U.S.C. 154(b) by 568 days.

(21) Appl. No.: 11/860,756

(22) Filed: Sep. 25, 2007

(65) Prior Publication Data

US 2008/0076039 A1 Mar. 27, 2008

(30) Foreign Application Priority Data

Sep. 26, 2006 (JP) ............................. 2006-260770

(51) Int. Cl.
*G03F 1/00* (2006.01)
(52) U.S. Cl. ............................. 430/5; 430/311; 430/394
(58) Field of Classification Search ...................... 430/5
See application file for complete search history.

(56) References Cited

U.S. PATENT DOCUMENTS

| | | | | |
|---|---|---|---|---|
| 6,107,000 A | * | 8/2000 | Lee et al. ..................... | 430/296 |
| 2004/0081899 A1 | * | 4/2004 | Misaka .......................... | 430/5 |
| 2005/0053844 A1 | * | 3/2005 | Wu ................................ | 430/5 |
| 2006/0183035 A1 | * | 8/2006 | Misaka .......................... | 430/5 |
| 2006/0192147 A1 | * | 8/2006 | Kandaka et al. .......... | 250/492.1 |
| 2006/0284052 A1 | | 12/2006 | Toshikiyo et al. | |
| 2006/0285228 A1 | | 12/2006 | Ishii et al. | |
| 2007/0146531 A1 | | 6/2007 | Toshikiyo | |
| 2007/0164329 A1 | | 7/2007 | Toshikiyo | |

FOREIGN PATENT DOCUMENTS

| | | |
|---|---|---|
| EP | 1696249 | 8/2006 |
| EP | 1736803 | 12/2006 |
| JP | 2001196568 | 7/2001 |
| JP | 2004117689 | 4/2004 |
| JP | 2006351972 | 12/2006 |
| WO | 2005059607 | 6/2005 |
| WO | 2005101067 | 10/2005 |

OTHER PUBLICATIONS

English language Abstract of JP 2006-351972.
English language Abstract of JP 2004-117689.
English language Abstract of JP 2001-196568.

\* cited by examiner

*Primary Examiner*—Mark F Huff
*Assistant Examiner*—Rashid Alam
(74) *Attorney, Agent, or Firm*—Greenblum & Bernstein, P.L.C.

(57) ABSTRACT

The phase shift mask according to the present invention is a phase shift mask for manufacturing a semiconductor device. The phase shift mask includes a light-blocking portion, a light-transmitting portion, a phase shift portion, and an auxiliary pattern portion, the light-blocking portion, the light-transmitting portion, the phase shift portion, and the auxiliary pattern portion being concentrically arranged, wherein a width of the auxiliary pattern portion in a radius direction is less than a width of the light-transmitting portion and a width of the phase shift portion in a radius direction. Furthermore, it is possible that a phase of exposure light which passes through an auxiliary pattern portion is opposite to a phase of exposure light which passes through a light-transmitting portion or a phase shift portion, the light-transmitting portion or the phase shift portion being the closest to the auxiliary pattern portion.

8 Claims, 10 Drawing Sheets

PHASE SHIFT MASK AND METHOD FOR MANUFACTURING LIGHT-COLLECTING DEVICE

BACKGROUND OF THE INVENTION (1) Field of the Invention

The present invention relates to a phase shift mask for manufacturing a semiconductor device, and in particular to a phase shift mask to be applied to an imaging apparatus and the like, and a method for manufacturing a light-collecting device using the phase shift mask.

(2) Description of the Related Art

In general, apparatuses which convert images into electric signals (such apparatuses are referred to as imaging apparatuses) are used in appliances which electromagnetically record images of such as digital video recorders, digital still cameras, and camera-equipped cellular phones which have been rapidly growing in number. In recent years, a charge-coupled device sensor which is a type of a semiconductor device (this is commonly referred to and abbreviated as a CCD sensor, hereinafter) and a MOS sensor are used as such imaging apparatuses. The introduction of such sensors has contributed to make the appliances smaller and lower-priced. Each of such imaging apparatuses is made up of fine-pixels respectively including one photodiode that are arranged on a plane. Accordingly, performance of an imaging apparatus is determined depending on the performances of these pixels.

The particularly significant performances of the imaging apparatus are a capability of converting a fine input image into an electric signal with low noise (i.e. low S/N ratio) and a capability of outputting the input image as a high electric signal (i.e. with high amplification factor).

As a method for realizing such a low S/N ratio and high amplification factor, a method for improving the S/N ratio and amplification factor of an imaging device in a pixel is generally suggested. Here, the following method is also commonly adopted.

Figure 1:
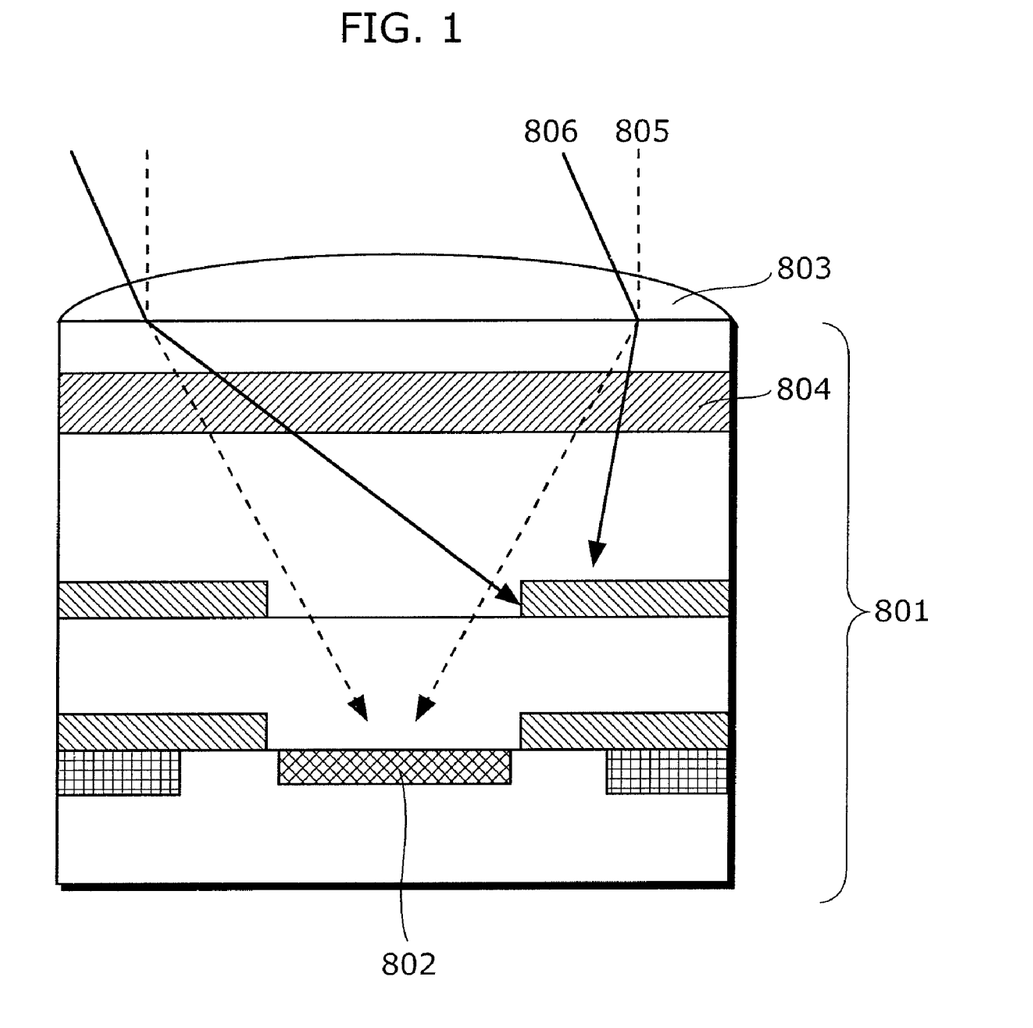
FIG. 1 shows a sectional view of an imaging device (pixel unit) in an imaging apparatus using a conventional technology.

FIG. 1 is a cross-sectional view of an imaging device (pixel unit) in a typical conventional imaging apparatus. A pixel 801 includes an imaging device 802, a light-collecting device 803, and a color filter 804. The incident light 805 entering the pixel 801 is collected by the light-collecting device 803, separated into one of red, blue, and green light by the color filter 804, and inputted into the imaging device 802. The intensity and density of the incident light 805 entering the imaging device 802 is increased by the light-collecting device 803. Therefore, the improvement in a low S/N ratio and an amplification factor can be realized.

Here, a problem is that a focal point of the light-collecting device 803 is changed along with the change of the incident angle of the incident light 805, so that the light can not be collected on the imaging device 802. This is obvious in the case where the pixel 801 is a peripheral pixel in the imaging apparatus.

In order to overcome this problem, there is a conventional example of arranging light-collecting devices in each pixel so as to be asymmetrical to each other (e.g. Japanese Unexamined Patent Application Publication No. 2001-196568). In addition, in a peripheral pixel of the imaging apparatus, the position of the imaging device 802 with respect to the light-collecting device 803 is conventionally displaced. However, in such a conventional example, when the incident angle for the incident light 805 is relatively small, an effect of displacing the position is high. However, a problem is that the effect becomes low when light enters at a large incident angle.

Figure 2A:
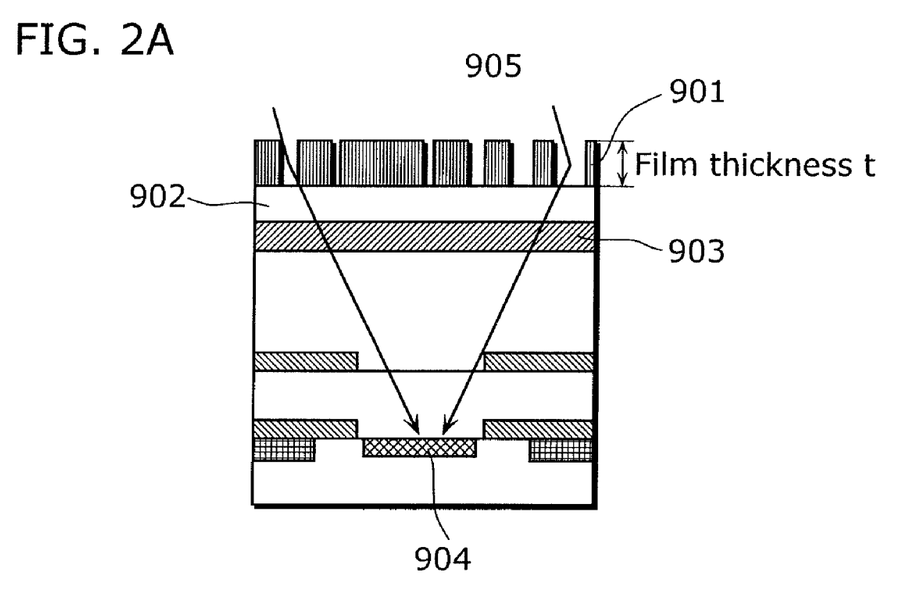
FIGS. 2A and 2B show a sectional view and a top view of an imaging device (pixel unit) having a light-collecting device.
Figure 2B:
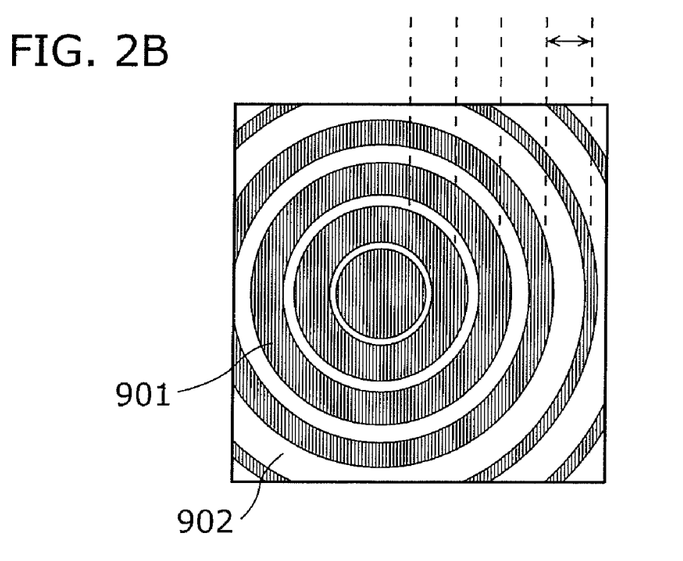

Here, in order to maintain pixel characteristics even in the case where light enters at a large incident angle, Japanese Unexamined Patent Application Publication No. 2004-117689 discloses a technique of forming a light-collecting device as shown in FIGS. 2A and 2B. 901 is a light-transmitting film, 902 is a substrate, 903 is a color filter, 904 is an imaging device, and 905 is the incident light. The light-transmitting films 901 are formed into circles sharing the same center or into zones. The width of a zone is as long as a wavelength of natural light. The width of a zone is typically as long as 0.1 μm. The refractive index for the incident light 905 which passes through the light-transmitting films 901 is a value averaged by a region as large as a wavelength on the surface of the light-transmitting films 901. This value is neither a value of the refractive index of the light-transmitting films 901 nor a value of the refractive index of a medium (typically, air). Since the width of a zone is very small, the refractive index of the incident light 905 depends on the width of the zone, and becomes a value between the refractive index of the light-transmitting films 901 and the refractive index of the medium. Specifically, the incident light 905 enters the surfaces of the light transmitting films 901 in which refractive indexes are distributed in concentric circles. Due to this refractive index distribution, the incident light 905 which has passed through the light-transmitting films 901 and the substrate 902 is collected by a diffraction effect and reaches the imaging device 902. A position where the incident light 905 is collected can be controlled by changing a shape of the light-transmitting films 901. Accordingly, incident light can be collected on the imaging device 902 without causing performance deterioration by designing the shape of the light-transmitting films 901 in consideration with an incident angle of the incident light 905, so that the aforementioned object can be achieved.

Figure 3:
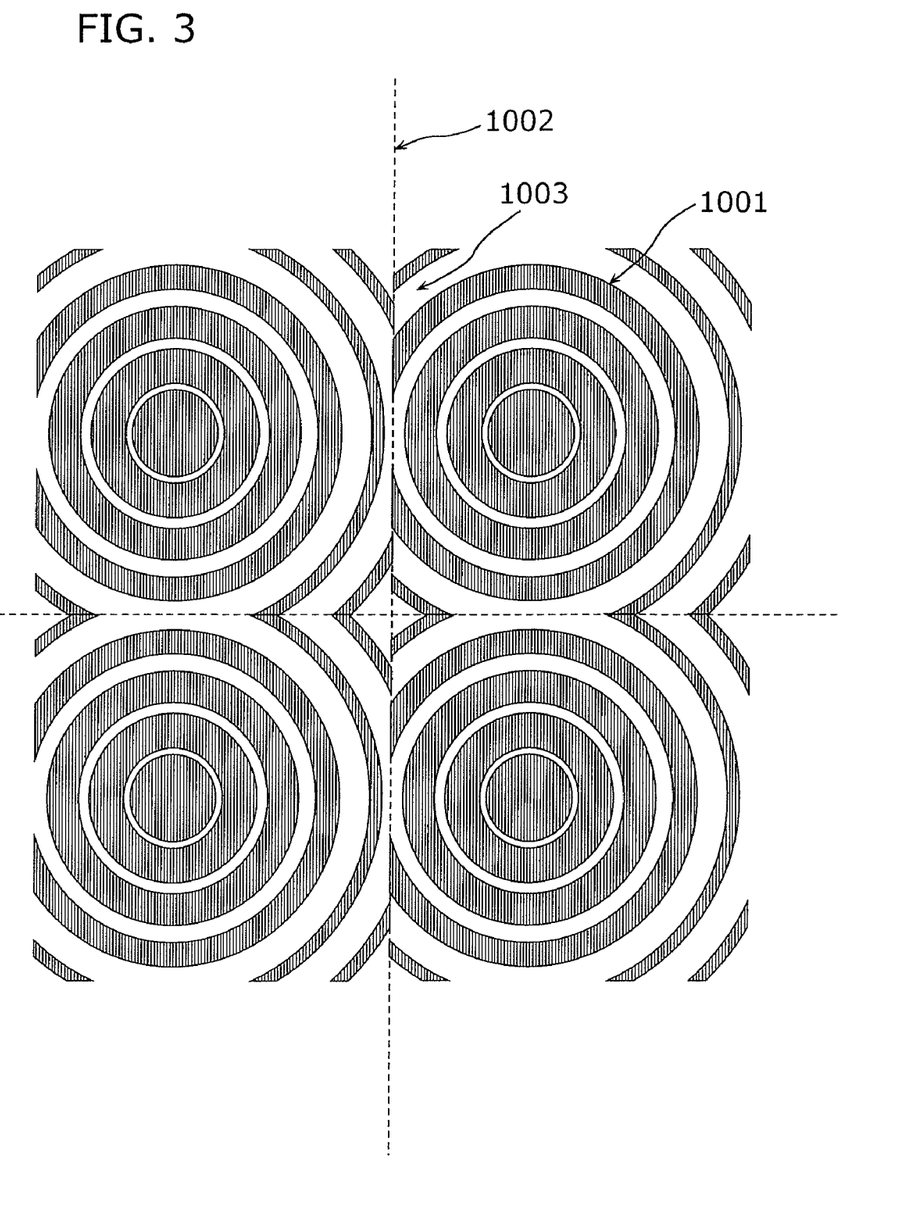
FIG. 3 shows light-collecting devices.

Actually, the center of the light-collecting device shown in FIGS. 2A and 2B is repeatedly formed as shown in FIG. 3. 1001 is a light-transmitting film, 1002 is a pixel boundary, and 1003 is an aperture.

In order to manufacture a light collecting device with such a structure using a photolithography technique, it is necessary to provide a photomask having a light-blocking portion in a region corresponding to the light-transmitting film 1001 and having a light-transmitting portion in a region corresponding to the aperture 1003 (although there may be the opposite case depending on a manufacturing method, it is assumed that the light-blocking portion is placed in a region corresponding to the light-transmitting film 1001, hereinafter).

When manufacturing the light collecting device, a problem is that it is difficult to fine-process circles or zones as fine as less than half of a wavelength of natural light for image-taking (approximately 100 nm). However, there is a problem when a conventional photomask is used. In other words, when a structure having a pattern less than a wavelength of a light source which is used for photo lithography is manufactured, large variations in a resist dimension occur due to the exposure variations in planarization on a substrate to be exposed to light. Alternatively, there are cases where a desired structure does not appear as a resist pattern. Thus, it is difficult to manufacture the desired fine structure precisely.

The current exposure source is light using KrF (wavelength of 0.248 μm) or light using ArF (wavelength of 0.193 μm). This indicates that it is possible to manufacture only a structure at a wavelength of approximately 0.2 μm.

For solving this problem, it is conceivable that a phase shift mask is used as a photomask for exposure. There are two types of phase shift masks, a halftone type and an interleave (Levenson) type. It is known that the Levenson type is more effective for the fine processing. The Levenson type phase shift mask (simply referred to as phase shift mask, hereinafter) is characterized in that light-transmitting portions and phase shift portions are alternately arranged having a light-blocking portion in between. Exposure light which passes through a phase shift portion is shifted by 180° in phase with respect to exposure light which passes through a light-transmitting portion.

In the phase shift mask, the following principle enables the fine processing. First, conventionally, constituent elements of the mask include only light-blocking portions and light-transmitting portions. Thus, when the width of the light-blocking portion is small, light is diffracted underneath the light-blocking portion due to a diffraction phenomenon, and a resist underneath the light-blocking portion is exposed to light. Thus, it becomes difficult to realize the fine structure. On the other hand, in the phase shift mask, light-transmitting portions and phase shift portions are arranged having light-blocking portions in between. Thus, the light which is diffracted underneath the light-blocking portion includes light from a light-transmitting portion and light from a phase shift portion. In this case, since the phases of each light are opposite to each other, the amplitude becomes small after the light is combined, and the exposure intensity is suppressed, so that the fine processing can be achieved even in the fine structure. Furthermore, an effect of improving contrast of the exposure intensity and the focal depth can be produced.

When this phase shift mask is applied for manufacturing the light-collecting device shown in FIGS. 2A and 2B, the following problem occurs. When the light-transmitting film 1001 which is the innermost located among the light-transmitting films 1001 of the light-collecting device is manufactured using the phase shift mask, a portion which is adjacent to the light-blocking portion on the phase shift mask corresponding to the innermost located light-transmitting film 1001 is either the light-transmitting portion or the phase shift portion. Thus, in these portions, it is difficult to realize the fine structure. The reason is that according to the principle of the phase shift mask, a light-transmitting portion and a phase shift portion appear, only when they are adjacent to each other having a light-blocking portion therebetween.

In other words, when a concentrically arranged pattern is manufactured, there is a problem that the effect of the phase shift mask can not be produced in some portions and it is difficult to perform the fine processing.

The object of the present invention is to provide a phase shift mask that is concentrically arranged and a method for manufacturing a light-collecting device which enhances the precision of the fine structure of a semiconductor apparatus.

SUMMARY OF THE INVENTION

In order to solve the aforementioned problems, the phase shift mask according to the present invention is a phase shift mask for manufacturing a semiconductor device. The phase shift mask includes a light-blocking portion, a light-transmitting portion, a phase shift portion, and an auxiliary pattern portion, the light-blocking portion, the light-transmitting portion, the phase shift portion, and the auxiliary pattern portion being concentrically arranged, wherein a width of the auxiliary pattern portion in a radius direction is less than a width of the light-transmitting portion and a width of the phase shift portion in a radius direction. With this structure, since the width of the auxiliary pattern portion is small, the auxiliary pattern portion passes through and diffracts the exposure light which is not substantially exposed to. Since a phase of the diffraction light which passes through the auxiliary pattern portion is opposite to a phase of the passing light of one of the closest light-transmitting portion and the closest phase shift portion, the diffraction light of the passing light cancels each other out. Thus, it is possible to increase the precision of the fine processing by exposing the closest light-transmitting portion and the phase shift portion to light.

Here, it is possible that a phase of exposure light which passes through an auxiliary pattern portion is opposite to a phase of exposure light which passes through a light-transmitting portion or a phase shift portion, the light-transmitting portion or the phase shift portion being the closest to the auxiliary pattern portion. With this structure, when the light-transmitting portion is closer to the auxiliary pattern portion than the phase shift portion, the phase of the exposure light which passes through the auxiliary pattern portion is shifted by 180°. When the phase shift portion is closer, the exposure light which passes through the auxiliary pattern portion is not shifted. As such, by making the phase of the exposure light which passes through the auxiliary pattern portion opposite to the phase of the exposure light which passes though the closer light-transmitting portion or the closer phase shift portion, it is possible to increase the precision of the exposure light by the closer light-transmitting portion or the closer phase shift portion, and to increase the precision of the fine processing.

Furthermore, it is possible that the auxiliary pattern portion is more interiorly located than the light-transmitting portion and the phase shift portion. With this structure, it is possible to increase the precision of the fine processing for a more interiorly located portion having a concentrically formed structure where the effect of the phase shift mask can not be produced in the conventional technology.

Here, it is possible that an inner side of the auxiliary pattern portion and an outer side of the auxiliary pattern portion are respectively adjacent to a light-blocking portion, and is arranged along a light-transmitting portion or a phase shift portion, the light-transmitting portion or the phase shift portion being the closest to the auxiliary pattern portion, the light-transmitting portion and the phase shift portion sandwiching the light-blocking portion. With this structure, it is possible to increase the precision of the fine processing for other than an innermost located portion having a concentrically formed structure.

Here, it is possible that the auxiliary pattern portion is located at a fixed distance from the closest light-transmitting portion or the closest phase shift portion. With this structure, it is possible to increase the precision of exposure light using the light-transmitting portion or the phase shift portion by locating the auxiliary pattern portion at a fixed distance from the closest light-transmitting portion or the closest phase shift portion.

Here, it is possible that a part of the light-transmitting portion is adjacent to the phase shift portion via the light-blocking portion, and an other part of the light-transmitting portion is adjacent to the auxiliary pattern portion via the light-blocking portion. With this structure, for example, when a concentrically arranged part is not in shape in the outer side, it is possible to align a part of the light-transmitting portion, the light-blocking portion, and the phase shift portion in order, and further to align an other part of the light-transmitting portion, the light-blocking portion, and the auxiliary pattern in order, thus to improve the precision of exposure light at the light-transmitting portion.

Here, it is possible that a part of the phase shift portion is adjacent to the light-transmitting portion via the light-blocking portion, and an other part of the phase shift portion is adjacent to the auxiliary pattern portion via the light-blocking portion. With this structure, for example, when a concentrically arranged part is not in shape in the outer side, it is possible to align a part of the phase shift portion, the light-blocking portion, and the light-transmitting portion in order, and further to align an other part of the phase shift portion, the light-blocking portion, and the auxiliary pattern in order, thus improving the precision of the exposure light at the phase shift portion.

Here, it is possible that a width of the auxiliary pattern portion is approximately equal to or less than one fourth of a wavelength of the exposure light. With this structure, it is possible to eliminate an effect of exposure light given by the light which passes through the auxiliary pattern portion and thus to prevent an unnecessary exposure pattern from being formed.

Furthermore, the method for manufacturing the light-collecting device of the present invention includes exposing a semiconductor to light, using the aforementioned phase shift mask. With this structure, it is possible to improve the precision of the fine processing of the light-collecting device.

Accordingly, the phase shift mask of the present invention has the aforementioned structure, and can improve the precision of the fine processing on concentrically arranged portions.

FURTHER INFORMATION ABOUT TECHNICAL BACKGROUND TO THIS APPLICATION

The disclosure of Japanese Patent Application No. 2006-260770 filed on Sep. 26, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The embodiments according to the present invention are described with reference to the diagrams hereinafter. In the diagrams, the same unit numbers indicate the same constituent elements.

First Embodiment

The phase shift mask according to the first embodiment includes a light-blocking portion, a light-transmitting portion, a phase shift portion, and an auxiliary pattern portion, the light-blocking portion, the light-transmitting portion, the phase shift portion, and the auxiliary pattern portion being concentrically arranged, wherein a width of the auxiliary pattern portion in a radius direction is less than a width of the light-transmitting portion and a width of the phase shift portion in a radius direction. Here, the width of the auxiliary pattern portion is so small that a resist is not substantially exposed to light which passes through the auxiliary pattern portion. A phase of exposure light which passes through an auxiliary pattern portion is opposite to a phase of exposure light which passes through a light-transmitting portion or a phase shift portion, the light-transmitting portion or the phase shift portion being the closest to the auxiliary pattern portion. With this, it is possible to facilitate the fine processing, because diffraction light of the exposure light which passes through the closest light-transmitting portion or the closest phase shift portion, and diffraction light of the exposure light which passes through the auxiliary patterns cancel each other out. Furthermore, it is possible that the auxiliary pattern portion is more interiorly located than the light-transmitting portion and the phase shift portion. With this structure, it is possible to increase the precision of the fine processing for a more interiorly located portion having a concentrically formed structure where the effect of the phase shift mask can not be produced in the conventional technology.

Figure 4:
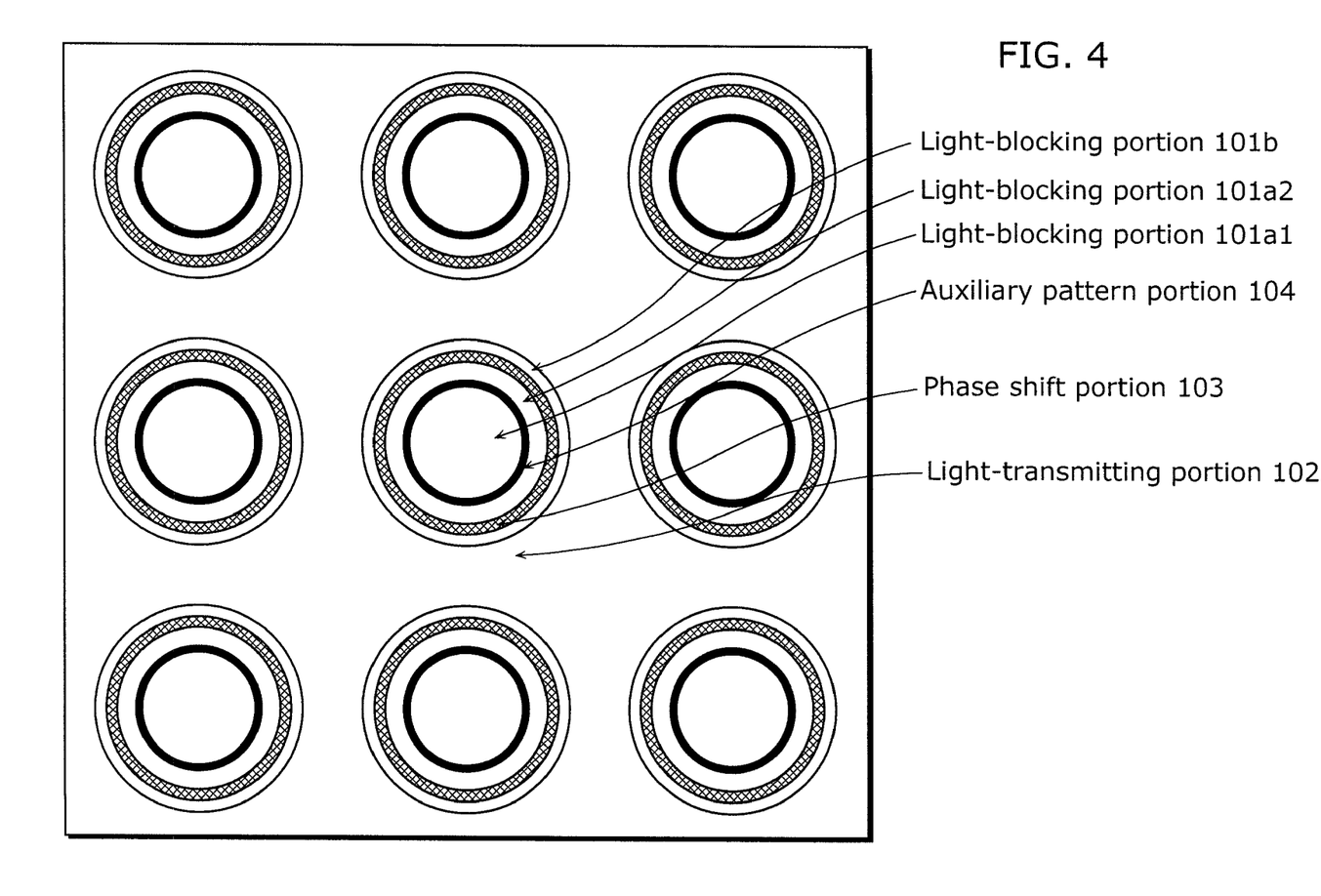
FIG. 4 shows patterns of the phase shift mask according to the first embodiment of the present invention.

FIG. 4 shows patterns of the phase shift mask according to the first embodiment of the present invention. This phase shift mask has plural patterns each concentrically formed (arranged in concentric circles). Each pattern includes light-blocking portions 101a1, 101a2, and 101b, a light-transmitting portion 102, a phase shift portion 103, and an auxiliary pattern portion 104, and is used for forming a light-collecting device on an imaging device (pixel unit).

The light-blocking portions 101a1 and 101a2 substantially form a light-blocking area. The reason is that the auxiliary pattern portion 104 formed between the light-blocking portion 101a1 and 101a2 is formed in a narrow width so as not to substantially expose the resist to the exposure light which is passed through.

Figure 5:
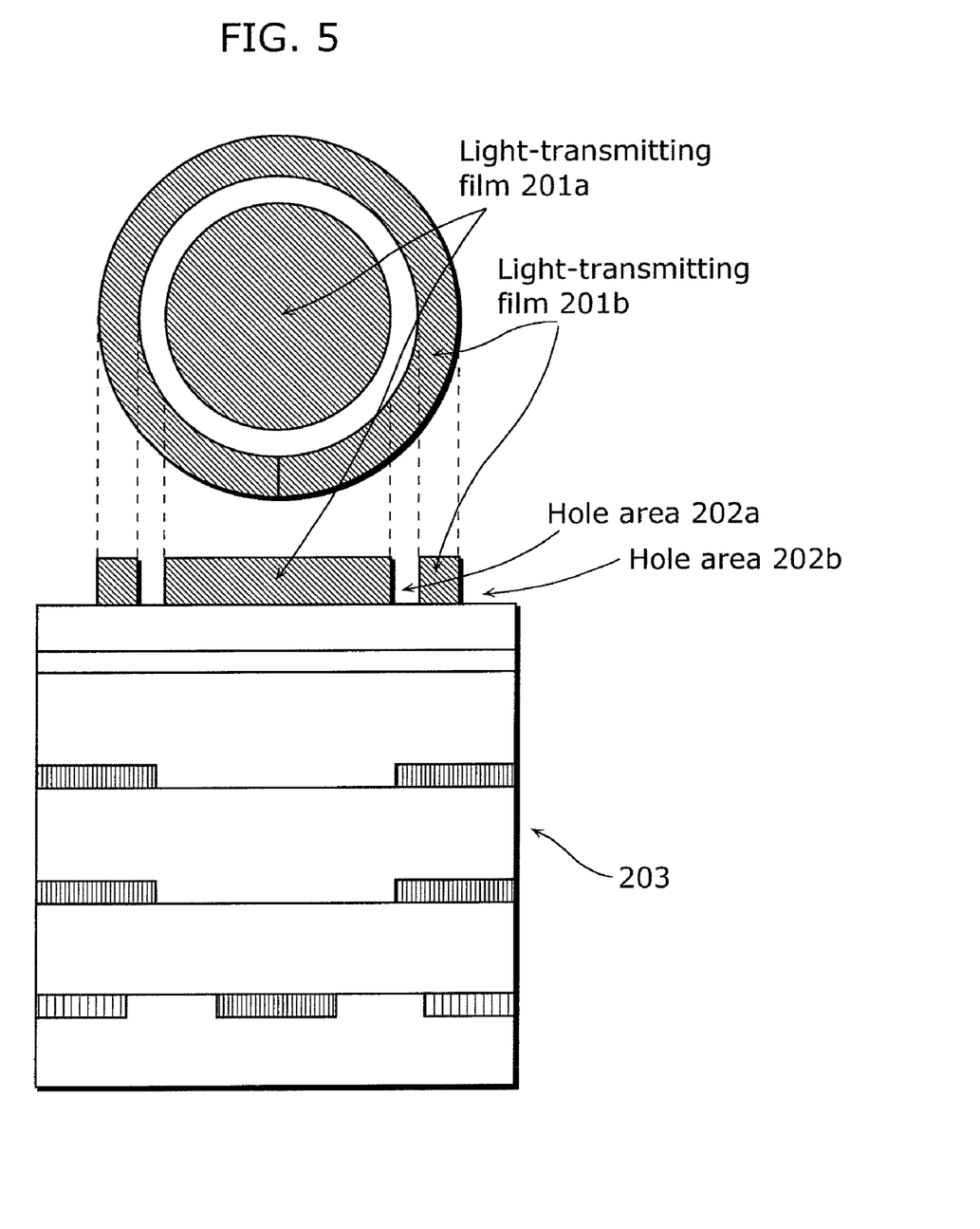
FIG. 5 shows a sectional view and a top view of a light-collecting device manufactured by the phase shift mask according to the first embodiment of the present invention.

FIG. 5 shows a top view and a sectional view of the light-collecting device manufactured by the phase shift mask shown in FIG. 4. In the light-collecting device, light-transmitting films 201a and 201b, and hole areas 202a and 202b are alternately arranged, and formed on an imaging device (pixel unit) 203. Since the light-transmitting films 201a and 201b are arranged in concentric circles, the volume ratio of the light-transmitting films 201a and 201b with respect to the hole area 202 varies in a radius direction. Since the refractive index for the light which passes from the top to the bottom varies, depending on the volume ratio, the light is collected. The typical width of the light-transmitting film 201 is equal to or less than 100 nm.

The light-blocking portions 101a1 and 101a2 correspond to the light-transmitting film 201a. The phase shift portion 103 corresponds to the hole area 202a. The light-blocking portion 101b corresponds to the light-transmitting film 201b.

The light-blocking portion 101b is between the light-transmitting portion 102 and the phase shift portion 103. Thus, with this structure, the same effect as the structure in which the light-transmitting portions, the light-blocking portions, and the phase shift portions are adjacent to each other can be produced, and an effect of the phase shift mask sufficiently emerges. Furthermore, even when the width of the light-transmitting film 201b is fine, the light-collecting device can be precisely formed.

The light-blocking portions 101a1 and 101a2 which correspond to the light-transmitting film 201a are surrounded by the phase shift portion 103. Without the auxiliary pattern portion 104, the precision of the fine processing of the light-transmitting film 201a is inferior to the light-transmitting film 201b. However, according to the first embodiment, since the auxiliary pattern portion 104 is formed in a portion corresponding to the light-transmitting film 201a, the precision of the fine processing can be improved.

The auxiliary pattern portion 104 is arranged so that a phase of the exposure light which passes through the auxiliary pattern portion 104 is opposite to a phase of the exposure light which passes through the phase shift portion 103. In the case where a portion of the phase shift portion 103 is a light-transmitting portion, the auxiliary pattern portion 104 is arranged so that the phase of the exposure light which passes through the auxiliary pattern portion 104 is opposite to the phase of the exposure light which passes through the light-transmitting portion.

In the case where the width of the auxiliary pattern portion 104 is large, an exposure pattern becomes such that a resist is exposed to light, and a redundant circular pattern is added to the light-collecting device shown in FIG. 5. However, according to the first embodiment, the width of the auxiliary pattern is set small so as not to be exposed to light. The width is approximately one fourth of a wavelength of the exposure light. When KrF is used to generate the exposure light, the width is assumed to be approximately 50 nm to 70 nm. Note that the actual width on the phase shift mask is the width obtained by multiplying the light-exposure ratio. For example, when the light-exposure ratio is four times, the actual dimension on the phase shift mask is approximately 200 nm to 280 nm.

Desirably, the auxiliary pattern portion 104 is arranged at a distance from the closest light-transmitting portion or the closest phase shift portion. In other words, the width of the light-blocking portion 101a2 between the auxiliary pattern portion 104 and the phase shift portion 103 in a radius direction is approximately half to two-third of the exposure wavelength. Note that this dimension is obtained by conversing the dimension to a dimension after transfer when manufacturing the light-collecting device, and the actual dimension on the phase shift mask is obtained by the multiplication with the light-exposure ratio. For example, when a KrF excimer laser is used for the exposure light, the width of the light-blocking portion 101 between the auxiliary pattern portion 104 and the phase shift portion 103 in a radius direction is approximately 130 nm to 170 nm. Furthermore, when it is assumed that the light-exposure ratio is four times, the actual dimension on the phase shift mask is approximately 520 nm to 680 nm.

Figure 6:
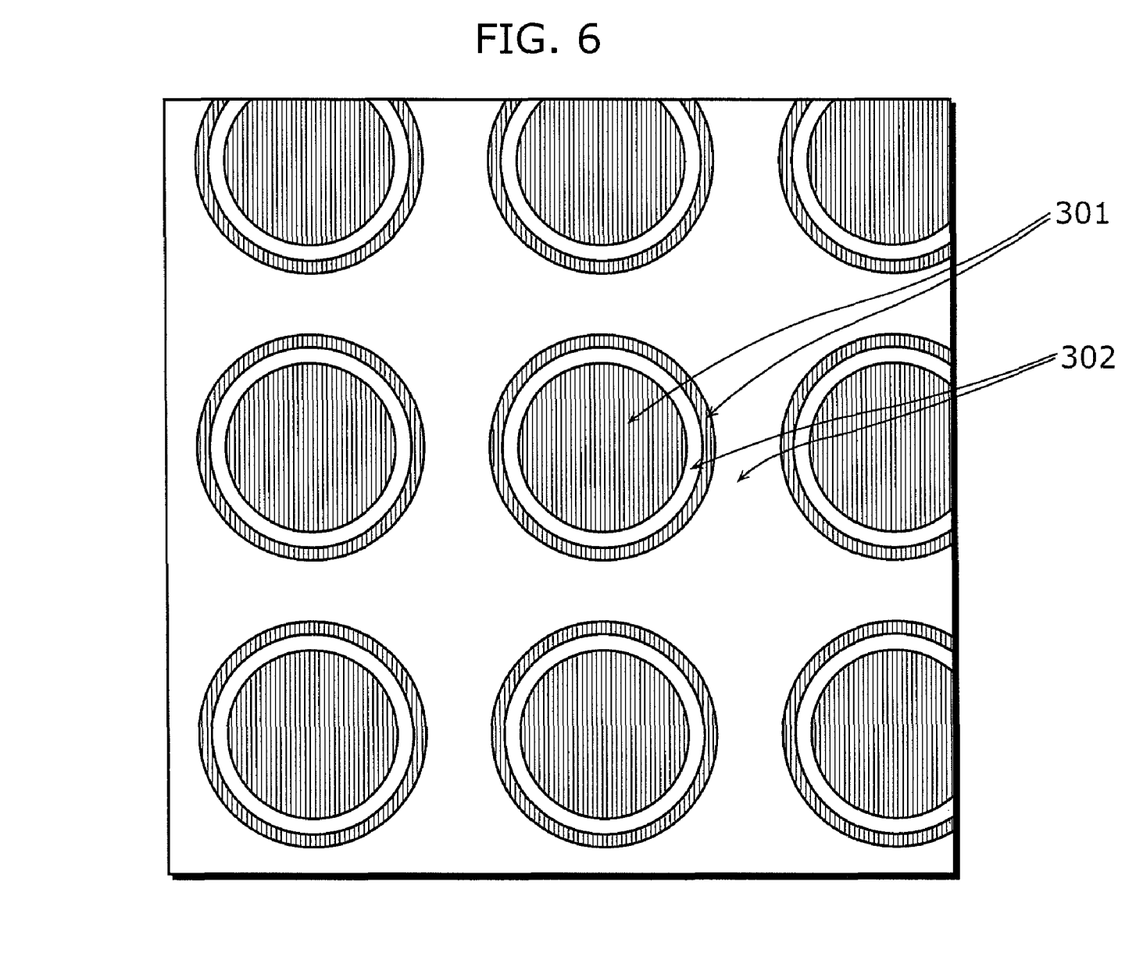
FIG. 6 shows resist patterns exposed to light, using the phase shift mask according to the first embodiment of the present invention.

FIG. 6 is a diagram showing resist patterns after exposed to light. Non-light-exposed resist remaining portions 301 and light-exposed resist eliminating portions 302 are alternately arranged.

Here, as the setting conditions, the width of the auxiliary pattern portion 104 is 200 nm, the transfer ratio is four times, and an excimer laser for the exposure light is used. Thus, the width is equivalent to 50 nm after the transfer. Furthermore, the width of the hole area 202a in FIG. 5 is 100 nm, and the width of the light-transmitting film 201b is 100 nm.

As shown in FIG. 6, in a portion corresponding to the auxiliary pattern portion 104, it is obvious that a resist is not substantially exposed to light, and a circle of the pattern 301 which is the innermost located is clearly formed.

As described above, since the phase shift mask according to the first embodiment includes the auxiliary pattern portions 104, it is possible to sufficiently realize an effect of a phase shift mask, in other words, an effect of canceling the diffraction light each other out, and to manufacture a light-collecting device shown in FIG. 5 without generating redundant patterns. Furthermore, it is possible to form light-transmitting films each having a concentrically arranged structure in which the fine processing has further been improved.

Note that even when a position of the light-transmitting portion 102 is replaced with that of the phase shift portion 103, and when a phase of the light which passes through the auxiliary pattern portion 104 becomes opposite, in the phase shift mask shown in FIG. 4, it is clear that the same effect can be obtained.

Furthermore, although a method for manufacturing a light-collecting device having light-transmitting films is exemplified herein, the present invention is not limited to the case, and it is clear that the method can be applied to other cases where other devices having the similar structure are manufactured.

Furthermore, although a phase shift mask for forming a light-collecting device having a structure which is arranged in concentric circles as a concentrically formed structure is described herein, a light-collecting device having an oval or polygon structure instead of the aforementioned structure can achieve the similar effect.

Second Embodiment

Figure 7:
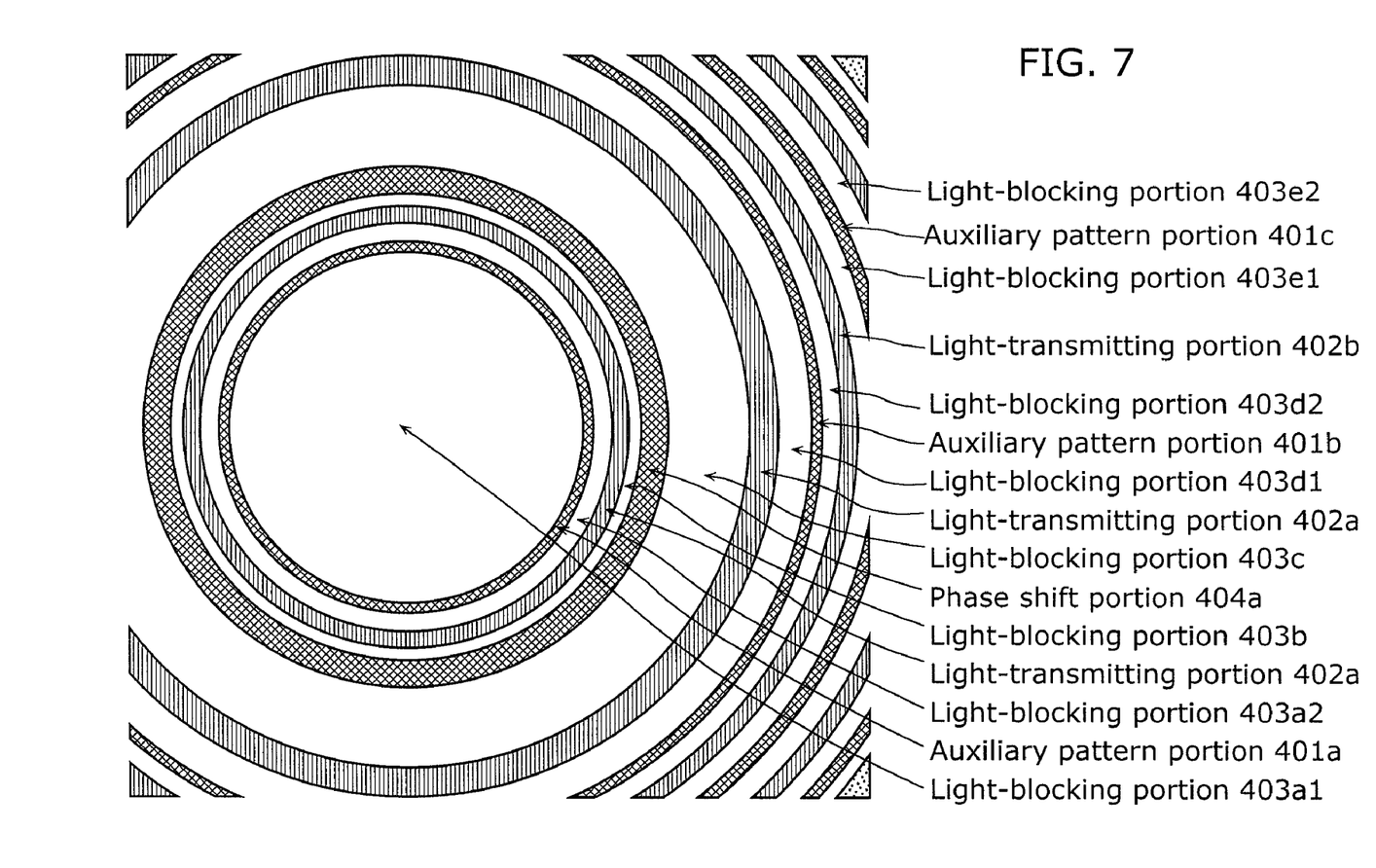
FIG. 7 shows patterns of the phase shift mask according to the second embodiment of the present invention.

FIG. 7 shows patterns of the phase shift mask according to the second embodiment of the present invention. In the diagram, in an order from the innermost side, the pattern includes a light-blocking portion 403a1, an auxiliary pattern portion 401a, a light-blocking portion 403a2, a light-transmitting portion 402a, a light-blocking portion 403b, a phase shift portion 404a, a light-blocking portion 403c, a light-transmitting portion 402a, a light-blocking portion 403d1, an auxiliary pattern portion 401b, a light-blocking portion 403d2, a light-transmitting portion 402b, a light-blocking portion 403e1, an auxiliary pattern portion 401c, and a light-blocking portion 403e2.

Figure 8:
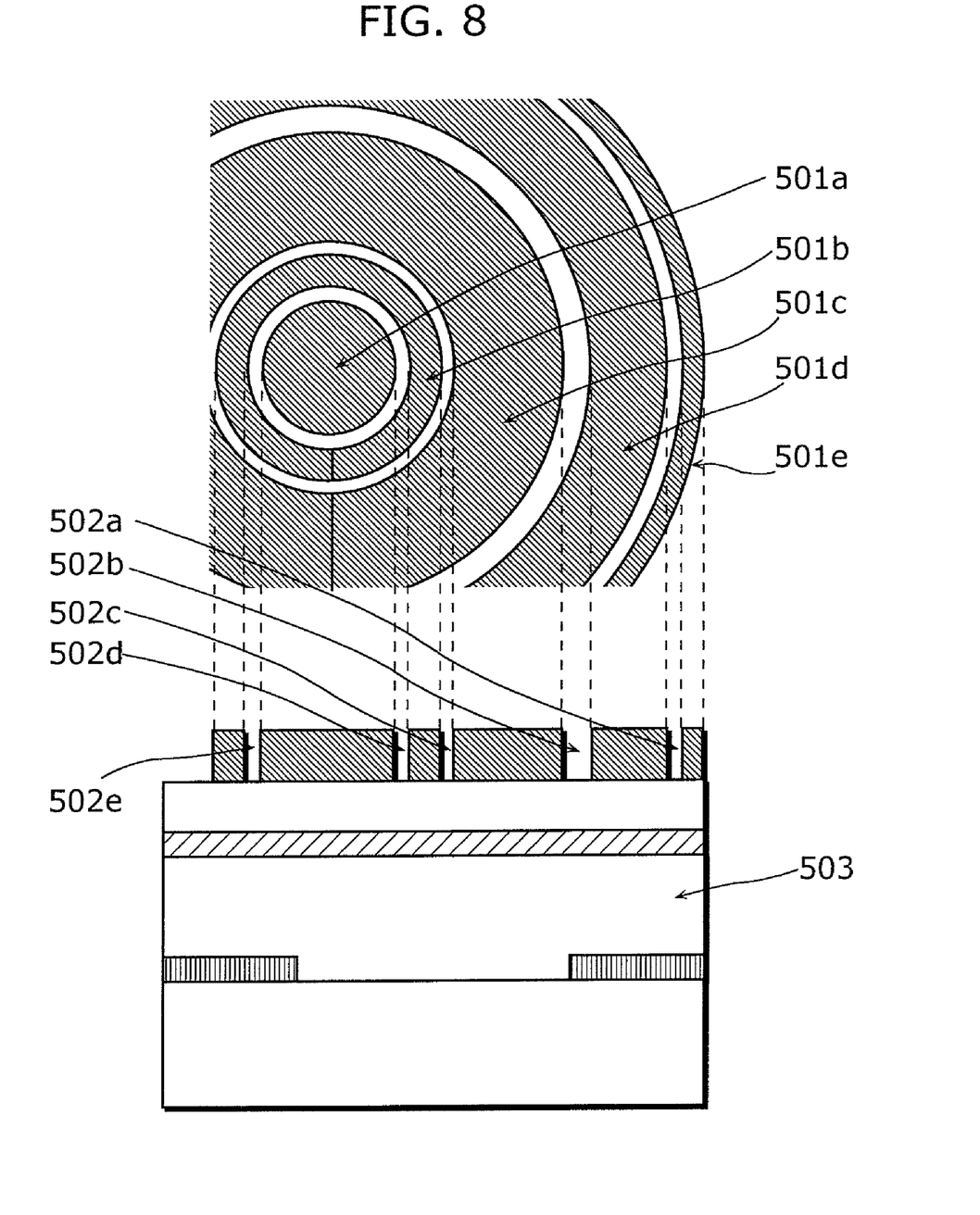
FIG. 8 shows a sectional view and a top view of a light-collecting device manufactured by the phase shift mask according to the second embodiment of the present invention.

FIG. 8 shows a top view and a sectional view of the light-collecting device manufactured by the phase shift mask shown in FIG. 7. The light-collecting device includes light-transmitting films 501a to 501e and hole areas 502a to 502d, and is formed on an imaging device (pixel unit) 503. The order of the dimension is almost similar to the light-collecting device shown in FIG. 5. The light-blocking portions 403a1 and 403a2 shown in FIG. 7 corresponds to the light-transmitting film 501a shown in FIG. 8. Similarly, the light-blocking portion 403b corresponds to the light-transmitting film 501b. The light-blocking portion 403a corresponds to the light-transmitting film 501c. The light-blocking portion 403d1 and 403d2 correspond to the light-transmitting film 501d. The light-blocking portions 403e1 and 403e2 correspond to the light-transmitting film 501e.

In this case, the auxiliary pattern portion 401a serves similarly as the auxiliary pattern portion 104 described in the first embodiment. In other words, the formation of the light-transmitting film 501*a* which is the innermost located produces an effect of the phase shift mask, and a finer structure can be formed.

In the light-collecting device shown in FIG. 8, the width of the light-transmitting film 501*d* is larger, and the width of the hole area 502*a* is smaller. In this case, a problem occurs when manufacturing the light-collecting device using a conventional phase shift mask. For example, it is conceivable that the hole area 502*b* corresponds to a light-transmitting portion of the phase shift mask, the light-transmitting film 501*d* corresponds to a light-blocking portion, and the hole area 502*a* corresponds to a phase shift portion. However, since the width of the light-transmitting film 501*d* is large, it is not possible to arrange the light-transmitting portion, the light-blocking portion, and the phase shift portion adjacent to each other. Thus, the effect of the phase shift mask can not be produced.

On the other hand, in the phase shift mask shown in FIG. 7, the auxiliary pattern portions 401*b* and 401*c* are arranged. Furthermore, the light-transmitting portion 402*b* is arranged as a corresponding portion of the hole area 502*b*.

Since the auxiliary pattern portions 401*b* and 401*c* are arranged adjacent to the light-transmitting portion 402*b*, it is possible to sufficiently produce an effect of a phase shift mask when the hole area 502*b* is formed, and to manufacture the light-collecting device even with the fine structure. Furthermore, the width of the auxiliary pattern portions 401*b* and 401*c* is the same as that of the auxiliary pattern portion 401*a*, and they are not transferred as redundant patterns.

In the case where the width of the auxiliary pattern portions 401 is large, an exposure pattern emerges due to the width, and a redundant circular pattern is added to the light-collecting device shown in FIG. 8. However, in the present invention, the width of the auxiliary pattern portions 401 is set small so as not to be exposed to light. The width is approximately one fourth of a wavelength of the exposure light. When KrF is used to generate the exposure light, the width is assumed to be approximately 50 nm to 70 nm. Note that the actual width on the phase shift mask is the width obtained by multiplying the light-exposure ratio. For example, when the light-exposure ratio is four times, the actual dimension on the phase shift mask is approximately 200 nm to 280 nm.

Each of the auxiliary pattern portions is arranged at a fixed distance from the closest light-transmitting portion or the closest phase shift portion. More specifically, it is assumed that the width of the light-blocking portion 403*d*2 between the auxiliary pattern portion 401*b* and the light-transmitting portion 402*b* in a radius direction is approximately half to two third of a wavelength of the exposure light. Furthermore, it is assumed that the width of the light-blocking portion 403*e*1 between the auxiliary pattern portion 401*c* and the light-transmitting portion 402*b* in a radius direction is also approximately half to two third of a wavelength of the exposure light. Note that this dimension is obtained by converting the dimension to a dimension after transfer, and the actual dimension on the phase shift mask is obtained by multiplying the light-exposure ratio. For example, when the KrF excimer laser is used for the exposure light, the width of the light-blocking portion 403 in a radius direction is approximately 130 nm to 170 nm. Furthermore, when it is assumed that the light-exposure ratio is four times, the actual dimension on the phase shift mask is approximately 520 nm to 680 nm.

Figure 9:
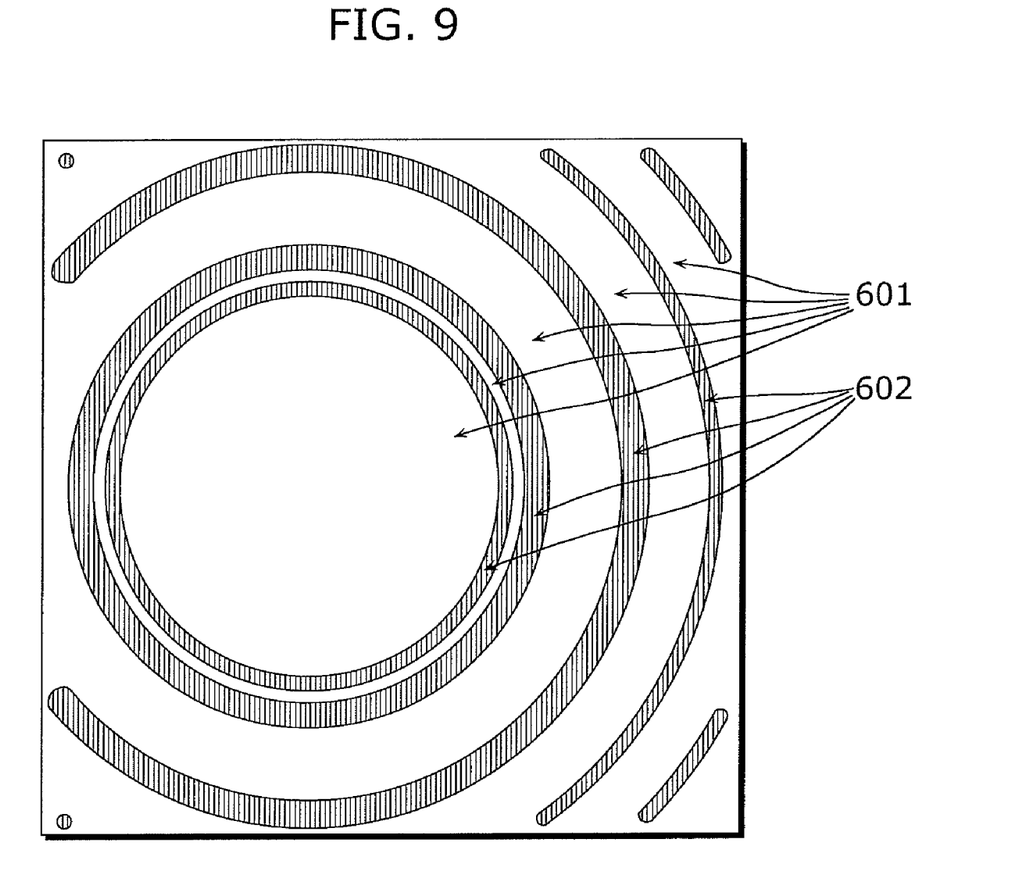
FIG. 9 shows a resist pattern exposed to light, using the phase shift mask according to the second embodiment of the present invention.

FIG. 9 is a diagram showing a resist pattern after exposed to light. Non-light-exposed resist remaining portions 601 and light-exposed resist eliminating portions 602 are alternately arranged.

Here, as the setting conditions, the width of the auxiliary pattern portion 401 is 200 nm, the transfer ratio is four times, and an excimer laser for the exposure light is used. Thus, the dimension is equivalent to 50 nm after the transfer. Furthermore, it is assumed that the width of the hole area 502*b* in FIG. 8 is 100 nm.

As shown in FIG. 9, in portions corresponding to the auxiliary pattern portions 401*a* to 401*c*, it is obvious that a resist is not substantially exposed to light, and a pattern arranged in concentric circles is clearly formed.

As described above, the auxiliary pattern portions in the phase shift mask according to the second embodiment are located at a fixed distance from the closest light-transmitting portion or the closest phase shift portion. Since a phase of exposure light which passes through the closest light-transmitting portion or the closest phase shift portion is opposite to a phase of exposure light which passes through the auxiliary pattern portion, it is possible to cancel out the diffraction light emitted from both sides of the light-blocking portion each other, and thus to improve the precision of the fine processing.

In other words, the phase shift mask according to the present embodiment includes: one of light-transmitting portions or phase shift portions (referred to as an isolation pattern portion); the first auxiliary pattern which is located inwards of the isolation pattern portion via the light-blocking portion (referred to as the first light-blocking portion); and the second auxiliary pattern which is located outwards of the isolation pattern portion via the light-blocking portion (referred to as the second light-blocking portion). The phase of the exposure light which passes through the isolation pattern portion is opposite to the phase of the exposure light which passes through the first auxiliary pattern, and is opposite to the phase of the exposure light which passes through the second auxiliary pattern. Since a phase of the exposure light which passes through the light-transmitting portion or the phase shift portion is opposite to a phase of the exposure light which passes through the auxiliary pattern portion, it is possible to cancel out the diffraction light emitted from both sides of the light-blocking portion each other, and to improve the precision of the fine processing.

Note that even when a position of the light-transmitting portion 402 is replaced with that of the phase shift portion 404, and when a phase of the exposure light which passes through the auxiliary pattern portion 401 becomes opposite, in the phase shift mask shown in FIG. 7, it is clear that the same effect can be obtained.

Third Embodiment

Figure 10:
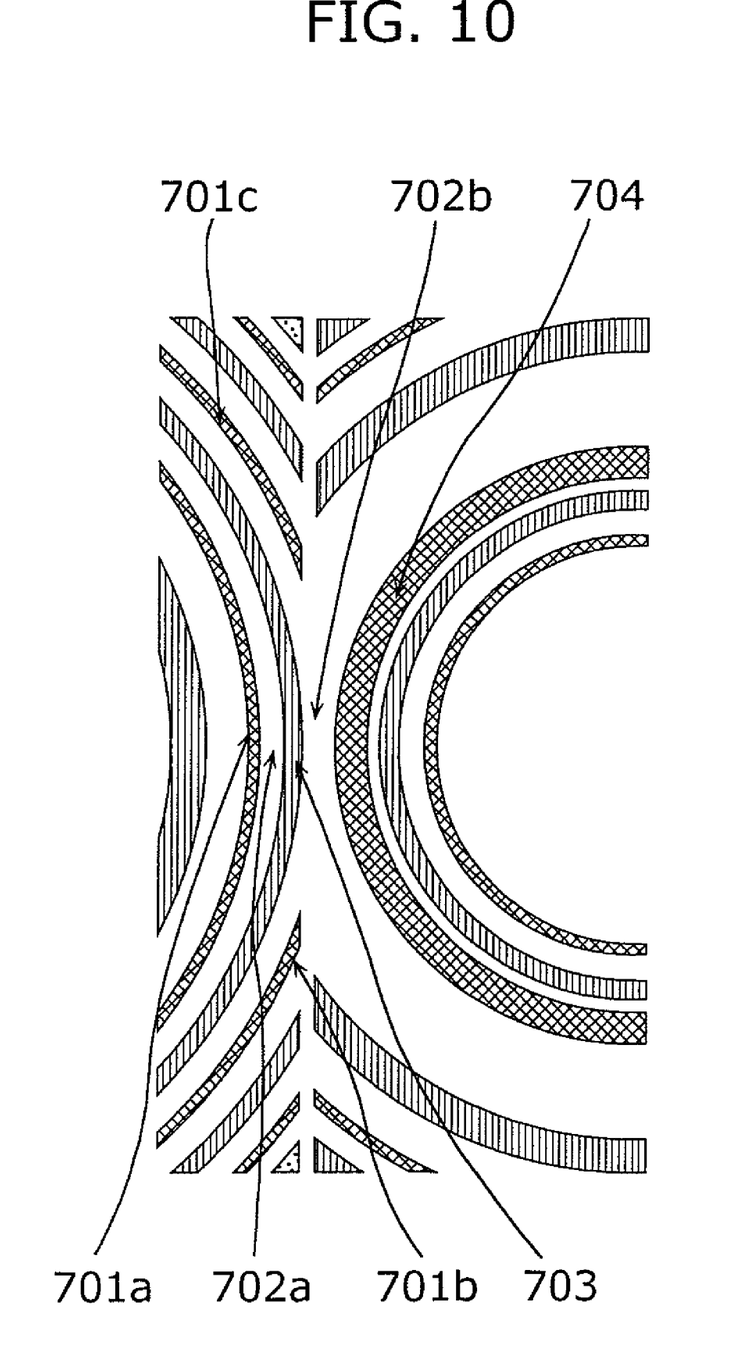
FIG. 10 shows patterns of the phase shift mask according to the third embodiment of the present invention.

FIG. 10 shows a phase shift mask according to the third embodiment of the present invention. 701*a*, 701*b*, and 701*c* are auxiliary pattern portions. 702*a* and 702*b* are light-blocking portions. 703 is a light-transmitting portion. 704 is a phase shift portion.

An auxiliary pattern portion 701*a* is located inwards of other patterns along the light-transmitting portion 703, in the phase shift mask shown in FIG. 10. At the outer side of the light-transmitting portion 703, there exists a part to which the phase shift portion 704 is adjacent and a part from which is the phase shift portion 704 is distant. Although the effect of the phase shift mask emerges sufficiently at the adjacent part, the effect does not sufficiently emerge at the distant part.

Thus, the auxiliary pattern portions 701*b* and 701*c* are located at the distant part. With this, even at such part, it is possible to sufficiently produce the effect of the phase shift mask, and to manufacture the light-collecting device with the fine structure.

The smaller values, in a radius direction, of the width of the auxiliary pattern portion 701 and the width of the light-blocking portion 702 which is adjacent to the auxiliary pattern portion 701 are set in a manner similar to the first and second embodiments.

As described above, in the phase shift mask according to the third embodiment, a part of the light-transmitting portion is adjacent to the phase shift portion via the light-blocking portion, and an other part of the light-transmitting portion is adjacent to the auxiliary pattern portion via the light-blocking portion. Furthermore, it is possible that a part of the phase shift portion is adjacent to the light-transmitting portion via the light-blocking portion, and an other part of the phase shift portion is adjacent to the auxiliary pattern portion via the light-blocking portion. By locating the auxiliary pattern portion in such a manner, it is possible to improve the precision of the fine processing even in a part where the light-transmitting portion and the phase shift portion are at a distance each other so as to sandwich the light-blocking portion.

Note that even when a position of the light-transmitting portion 703 is replaced with that of the phase shift portion 704, in the phase shift mask shown in FIG. 10, and when a phase of the exposure light which passes through the auxiliary pattern portion 701 becomes opposite, it is clear that the same effect can be obtained.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The phase shift mask according to the present invention is useful in manufacturing a light-collecting device which is used in an imaging device. Furthermore, it is useful in manufacturing a semiconductor device having a fine and concentrically arranged structure.

What is claimed is:

1. A phase shift mask for manufacturing a semiconductor device, said phase shift mask comprising:
   a first light-blocking portion;
   an auxiliary pattern portion adjacent to and outside of said first light-blocking portion;
   a second light-blocking portion adjacent to and outside of said auxiliary pattern portion; and
   a third portion comprising a phase shift portion or a light-transmitting portion, said third portion being adjacent to and outside of said second light-blocking portion;
   wherein a width of said auxiliary pattern portion in a radius direction is less than a width of said light-transmitting portion and a width of said phase shift portion in a radius direction, such that the auxiliary pattern portion does not substantially expose an underlying resist to exposure light which is transmitted to the phase shift mask, and
   a portion of the exposure light which has passed through said auxiliary pattern portion has a phase opposite to a phase of a portion of the exposure light which has passed through said third portion.

2. The phase shift mask according to claim 1,
   wherein said auxiliary pattern portion is located at a fixed distance from said third portion.

3. The phase shift mask according to claim 1, further comprising a first light-transmitting portion, a first phase shift portion, and a third light-blocking portion,
   wherein said first light-transmitting portion is adjacent to said first phase shift portion via said third light-blocking portion, and
   said third portion is adjacent to said auxiliary pattern portion via said second light-blocking portion.

4. The phase shift mask according to claim 1,
   wherein the width of said auxiliary pattern portion is approximately equal to or less than one fourth of a wavelength of the exposure light.

5. A method for manufacturing a light-collecting device, said method comprising
   exposing a resist on a semiconductor to exposure light using a phase shift mask which comprises:
   a first light-blocking portion;
   an auxiliary pattern portion adjacent to and outside of the first light-blocking portion;
   a second light-blocking portion adjacent to and outside of the auxiliary pattern portion; and
   a third portion comprising a phase shift portion or a light-transmitting portion, the third portion being adjacent to and outside of the second light-blocking portion,
   wherein a width of the auxiliary pattern portion in a radius direction is less than a width of the light-transmitting portion and a width of the phase shift portion in a radius direction, such that the auxiliary pattern portion does not substantially expose the resist to the exposure light, and
   a portion of the exposure light which has passed through the auxiliary pattern portion has a phase opposite to a phase of a portion of the exposure light which has passed through the third portion.

6. The method according to claim 5,
   wherein the width of the auxiliary pattern portion is approximately equal to or less than one fourth of a wavelength of the exposure light.

7. The phase shift mask according to claim 2,
   wherein the width of said auxiliary pattern portion is approximately equal to or less than one fourth of a wavelength of the exposure light.

8. The phase shift mask according to claim 3,
   wherein the width of said auxiliary pattern portion is approximately equal to or less than one fourth of a wavelength of the exposure light.

* * * * *